United States Patent [19]
Lundin

[11] Patent Number: 4,622,686
[45] Date of Patent: Nov. 11, 1986

[54] UP/DOWN COUNTER INTERFACE MEANS

[75] Inventor: Robert S. Lundin, Northfield, Conn.

[73] Assignee: The Superior Electric Company, Bristol, Conn.

[21] Appl. No.: 662,821

[22] Filed: Oct. 19, 1984

[51] Int. Cl.[4] .......................................... H03K 21/02
[52] U.S. Cl. ...................................... 377/55; 307/440
[58] Field of Search ..................... 377/55, 45; 307/480, 307/440, 445, 269

[56] References Cited
U.S. PATENT DOCUMENTS

| | | | |
|---|---|---|---|
| 3,206,665 | 9/1965 | Burlingham | 307/470 |
| 3,735,347 | 5/1973 | Whitney et al. | 377/45 |
| 4,132,905 | 1/1979 | Stein | 307/471 |
| 4,303,851 | 12/1981 | Mottier | 377/45 |

OTHER PUBLICATIONS

"Crossover Circuit" by G. A. Maley, IBM Technical Disclosure Bulletin, vol. 7, No. 12, May 1965.

Primary Examiner—John S. Heyman
Assistant Examiner—K. Ohralik
Attorney, Agent, or Firm—John H. Crozier

[57] ABSTRACT

An up/down counter interface converts input information suitable for the operation of one type up/down counter, which type receives input information in the form of a direct current logic signal indicating direction and a train of electric pulses representing increments of information, to input information suitable for the operation of a second type up/down counter, which second type receives input information in the form of two identical pulse trains representing increments of information, direction being determined by the relative displacement in time of the two pulse trains.

1 Claim, 2 Drawing Figures

UP/DOWN COUNTER INTERFACE MEANS

BACKGROUND AND SUMMARY OF THE INVENTION

This invention relates to electronic up/down counters, and more particularly to means for converting the characteristics of the inputs normally processed by one type of up/down counter to the characteristics of the inputs normally processed by another type of up/down counter.

Electronic up/down counters are well-known devices, usually in the form of integrated circuits, widely used in electronic circuits processing digital information in a variety of information display and control applications.

There are two types of up/down counters commonly employed in such circuits. A first type, such as the Motorola Part No. MC14510B, receives two input signals: one input signal is a train of electric pulses representing increments of information which might represent, for example, steps taken by a stepping motor; the other input signal is a direct current logic signal indicating direction, i.e., whether the count of the pulses in the first signal is additive or subtractive. A second type of up/down counter, such as the Texas Instruments Part No. SN54192, also receives two input signals which are identical pulse trains each representing the increments of information; however, the two pulse trains are electrically displaced from one another and are typically in quadrature. The up/down counter of the second type determines direction by sensing which pulse train is leading the other.

The input information suitable for operation of the first type of up/down counter cannot be used directly to operate the second type of up/down counter; however, it would be desirable to be able to convert the inputs suitable for the first type for use with the second type. Accordingly, it is an object of the present invention to provide means for converting input information suitable for the operation of the first type of up/down counter to input information suitable for operation of the second type of up/down counter. The present invention accomplishes this object through a novel logic circuit hereinafter described.

DETAILED DESCRIPTION OF THE PREFERRED EMBODIMENT

Figures 1, 2:
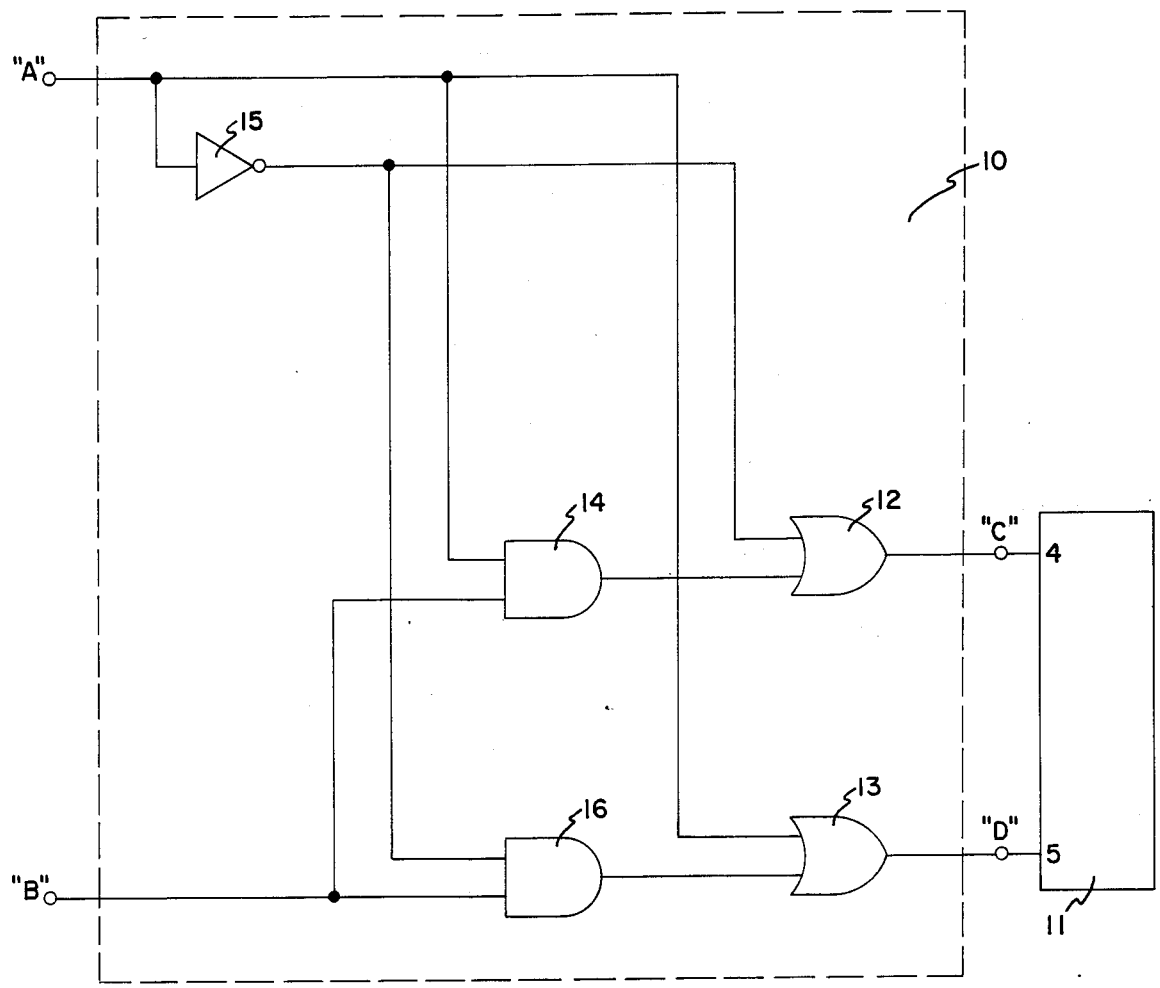
FIG. 1 is a schematic diagram showing the elements of the present invention.
FIG. 2 is a logic table showing the relationships between the inputs and outputs of the present invention.

Referring to the Drawing, FIG. 1 is a schematic diagram of the updown/counter interface of the present invention, generally indicated by the reference numeral 10, which is used to provide inputs to an up/down counter 11 of the second type described above, which may be assumed to be a Texas Instruments Part No. SN54192. The up/down counter 11 receives inputs from the outputs of logic OR gates 12 and 13. Logic OR gate 12 receives inputs from the output of a logic AND gate 14 and from an inverter 15. Logic OR gate 13 receives one input from a circuit input connection "A" and a second from logic AND gate 16. Logic AND gate 14 receives inputs from circuit input "A" and from a circuit input connection "B". Logic AND gate 16 receives inputs from the output of inverter 15 and from circuit input "B". The inverter 15 receives input from circuit input "A".

In operation, circuit input "A" is a direct current logic signal which indicates direction. Circuit input "B" is a pulse train of incremental information items. When a high level logic signal is received at circuit input "A", the high level is sensed by logic AND gate 14 which is simultaneously receiving the pulse train signal from circuit input "B" (a high level signal). Logic AND gate 14 passes the pulse train signal to logic OR gate 12 which is at that point receiving a low level input from the output of the inverter 15, since the inverter input is the high level signal from circuit input "A". Consequently, logic OR gate 12 passes the pulse train signal from circuit input "B" through circuit output connection "C" to input pin 4 on the up/down counter 11. Simultaneously, logic OR gate 13 is receiving a high level signal from circuit input "A" which it passes through circuit output connection "D" to input pin 5 on the up/down counter 11, since logic OR gate 13 is then receiving no output signal from logic AND gate 16, as that AND gate is receiving the pulse train signal from circuit input "B", but is receiving a low level signal from the output of the inverter 15. With the constant high level signal on input pin 5 of the up/down counter 11, that signal appears to the up/down counter as leading the pulse train received on input pin 4 and the conditions are satisfied for counting down.

When the direction information is reversed, there is a low level logic signal at circuit input "A". The low level signal is sensed by the inverter 15 which produces a high level signal output. This high level signal is sensed by logic AND gate 16 which is simultaneously receiving the pulse train signal from circuit input "B". Logic AND gate 16 passes the pulse train signal to logic OR gate 13 which is at that point receiving the low level signal from the circuit input "A". Consequently, logic OR gate 13 passes the pulses train signal to input pin 5 on the up/down counter 11. Simultaneously, logic OR gate 12 is receiving the high level signal from the output of the inverter 15 which it passes to input pin 4 on the up/down counter 11, since logic OR gate 12 is then receiving no output signal from logic AND gate 14, as logic AND gate 14 is receiving the low level signal from circuit input "A" and the pulse train signal from circuit input "B". With the constant high level signal on input pin 5 on the up/down counter 11, that signal appears to the up/down counter as leading the pulse train received on input pin 4 and the conditions are satisfied for counting up.

FIG. 2 illustrates, in tabular form, the inputs and outputs of the logic circuit described above, at various signal levels. At condition a, the pulse train is at circuit input "B", circuit input "A" is at low level, and the up/down counter 11 counts "up" the pulse train appearing at circuit output "D". At condition b, the pulse train is again at circuit input "B", but circuit input "A" is at high level and the up/down counter 11 counts "down" the pulse train appearing at circuit output "C". With no pulse train signal at circuit input "B", the up/down counter 11 does not count, although it may continue to receive the direction information received by the logic circuit at circuit input "A" and appearing at either circuit output "C" or circuit output "D".

It will be understood that what has been disclosed is a novel logic circuit for converting the input information suitable for operation of a first type of up/down counter, which information consists of a pulse train and a direct current logic signal, to the input information suitable for operation of a second type of up/down counter, which information consists of two identical pulse trains electrically displaced from one another.

Since certain changes may be made in carrying out the above invention without departing from the scope thereof, it is intended that all matter contained in the above description or shown in the accompanying Drawing shall be interpreted as illustrative and not in a limiting sense.

It is also intended that the following Claims are intended to cover all of the generic and specific features of the invention herein described, and all statements of the scope of the invention which, as a matter of language, might be said to fall therebetween.

I claim:

1. An up/down counter interface for converting input information suitable for operation of a first type of up/down counter, which type receives as a first input a direct current logic signal indicating direction and as a second input a train of electric pulses representing increments of information, to input information suitable for operation of a second type of up/down counter, which second type receives as a first input the aforesaid train of electric pulses and as a second input a train of electric pulses identical to the first input except displaced therefrom in time, with direction being determined by the second type of counter from the relative displacement in time of the first and second inputs, comprising:

(a) a first interface input connection to receive the direct current logic signal;

(b) a second interface input connection to receive the train of electric pulses;

(c) first and second interface output connections adaptable to be connected to an up/down counter of the second type;

(d) a first logic OR gate, the output of which is the first interface output;

(e) a second logic OR gate, the output of which is the second interface output and one input of which is the first interface input;

(f) a first logic AND gate, the output of which is one input of the first logic OR gate, and the two inputs of which are the first and second interface inputs;

(g) a second logic AND gate, the output of which is one of the inputs of the second logic OR gate and one input of which is the second interface input; and (h) an inverter, the input of which is the first interface input and the output of which is an input of the first logic OR gate and an input of the second logic AND gate;

wherein, when the direct current logic signal is at a high level, it will appear on the first interface output and the train of electric pulses will appear on the second interface output, and the up/down counter of the second type connected to the outputs will count the pulses in one direction; and when the direct current logic signal is at a low level, it will appear on the second interface output and the train of electric pulses will appear on the first interface output, and the up/down counter of the second type connected in the same manner to the outputs will count the electric pulses in the opposite direction.

* * * * *